United States Patent [19]
Nishikawa

[11] Patent Number: 5,848,003
[45] Date of Patent: Dec. 8, 1998

[54] SEMICONDUCTOR MEMORY

[75] Inventor: Katsumi Nishikawa, Tokyo, Japan

[73] Assignee: NEC Corporation, Tokyo, Japan

[21] Appl. No.: 884,265

[22] Filed: Jun. 27, 1997

[30] Foreign Application Priority Data

Jun. 27, 1996 [JP] Japan .................................. 8-167893

[51] Int. Cl.⁶ .................................................. G11C 7/00
[52] U.S. Cl. ..................................... 365/200; 365/230.03
[58] Field of Search ............................... 365/200, 225.7, 365/230.06, 230.03

[56] References Cited

U.S. PATENT DOCUMENTS

| 4,601,019 | 7/1986 | Shah et al. | 365/200 |
| 5,570,318 | 10/1996 | Ogawa | 365/200 |
| 5,617,365 | 4/1997 | Horiguchi et al. | 365/200 |

FOREIGN PATENT DOCUMENTS 60-150300  8/1985  Japan .

Primary Examiner—Son Mai
Attorney, Agent, or Firm—Foley & Lardner

[57] ABSTRACT

There are provided memory cell arrays MA1 to MA4 each of which includes a predetermined number of redundant memory cell rows and a predetermined number of redundant memory cell columns, and which are caused to partially operate by a block selecting signal BS. Replacement address programming circuits RAP1 to RAP4 of the number smaller than the number of the redundant memory cell rows, are provided. Each of the replacement address programming circuits stores the row address of a defective memory cell(s) existing in the memory cell arrays MA1–MA4, and outputs a redundant row selection discriminating signal RSJ1–RSJ4 of an activated level when a row address signal XA designates the stored row address. Further, selection circuits RS1 to RS8 are provided for selecting one of the redundant row selection discriminating signals RSJ1 to RSJ4 and selecting a corresponding redundant memory row. The number of redundant column address programming circuits included in redundant column selection circuits RYS1 and RYS2 is made smaller than the number of the redundant memory cell columns.

5 Claims, 13 Drawing Sheets

RXSi REDUNDANT ROW SELECTION CIRCUIT (i=1~8)

( i=1,2,7,8 )

( i=1,2,7,8 )

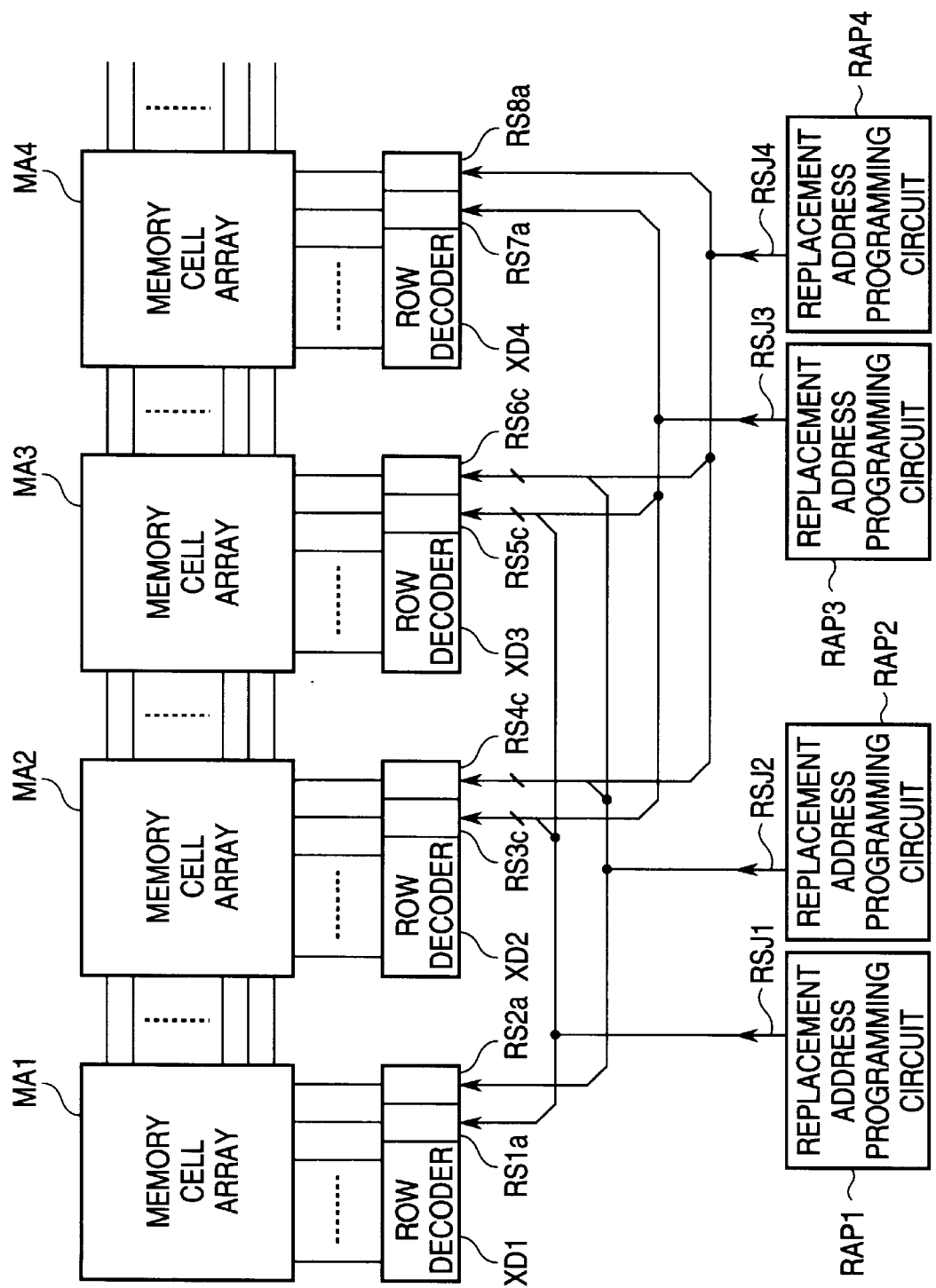

SEMICONDUCTOR MEMORY

BACKGROUND OF THE INVENTION

1. Field of the Invention

The present invention relates to a semiconductor memory, and more specifically to a semiconductor memory having a redundancy circuit.

2. Desicription of Related Art

It is a general practice that a semiconductor memory is provided with a redundant circuit as a recovery means used when a defective memory cell occurred. One typical example of the prior art semiconductor memory having the redundant circuit (first example) is shown in FIG. 1.

This semiconductor memory includes a plurality of memory cell arrays MA1 to MA4 each of which includes memory cells (not shown) arranged in a plurality of rows and a plurality of columns, a predetermined number of redundant memory cell rows (not shown) (two rows in the shown example) each composed of redundant memory cells corresponding to one row of memory cells, a predetermined number of redundant memory cell columns (not shown) (two columns in the shown example). The semiconductor memory also includes a plurality of word lines WL1 to WLM respectively provided to associate to respective memory cell rows of all the memory cell arrays MA1 to MA4, for selecting the memory cells of the row designated by a selection level, a predetermined number of redundant word lines (RWL1, RWL2, RWL3, RWL4, RWL5, RWL6, RWL7 and RWL8, some of which is not shown in the drawing) provided to associate to the predetermined number of redundant memory cell rows, respectively, for selecting the redundant memory cells of the row designated by a selection level, a plurality of digit lines DL1 to DLN provided in coimmon to the memory cell arrays MA1 to MA4 to associate to the plurality of memory cell columns of each of the memory cell arrays MA1 to MA4, respectively, for transferring data of the memory cells of the column designated by a selection level, and a plurality of redundant digit lines RDL1 and RDL2 provided in common to the memory cell arrays MA1 to MA4 to associate to the predetermined number of redundant memory cell columns, respectively, for transferring data of the redundant memory cells of the column designated by a selection level. The semiconductor memory further includes a plurality of row decoders XD1 to XD4 provided for the memory cell arrays MA1 to MA4, respectively, and each activated in response to a block selecting signal BS (some of which is not shown in the drawing) for bringing, to the selection level, one of the plurality of word lines WL1 to WLM in accordance with a row address signal XA (constituent bits X0 to Xm) when the redundant word lines are (at a non-selection level, redundant row selection circuits RXS1 to RXS8 provided for the redundant word lines RWL1 to RWL8, respectively, and each for bringing a corresponding redundant word line to the selection level when the row address signal XA designates a stored address, a column decoder YD for selecting, by means of a switch circuit SW, one of the plurality of digit lines DL1 to DLN in accordance with a column address signal YA (constituent bits Y0 to Yn) when both of the redundant digit lines RDL1 and RDL2 are at a non-selection level, and a redundant column selection circuits RYS1x and RYS2x including replacement address programming circuits in correspondence to the predetermined number of redundant memory cell columns of the memory cell arrays MA1 to MA4, and each for selecting, by means of the switch circuit SW, the corresponding redundant digit line, in response to an active level of a corresponding block selecting signal BS, when the column address designates the address stored in the replacement address programming circuit.

Incidentally, the digit lines DL1 to DLN and the redundant digit lines RDL1 and RDL2 are connected to sense amplifiers (not shown), so that data of selected memory cells or redundant memory cells are amplified by the sense amplifiers, and the data is selected by the column decoder YD, the redundant column selection circuits RDS1 and RDS2 and the switch circuit SW, and is outputted through an input/output bus IO to an external.

FIG. 2 is a circuit diagram illustrating a specific circuit example of the redundant row selection circuits RXS1 to RXS8.

This circuit includes a transistor Q511 on-off controlled by a precharge signal Φx for precharging a replacement address detecting node N50 to a power supply potential VCC at a predetermined timing, source grounded transistors Q50a, Q50b, ..., Q5ma, Q5mb having their gate receiving the constituent bits X0 to Xm of the row address signal XA and their inverted bits, respectively, fuses F50a, F50b, ..., F5ma, F5mb having their one end connected to a drain of the transistors Q50a, Q50b, ..., Q5ma, Q5mb, respectively, and their other end connected in common to the replacement address detecting node N50, an inverter IV511 having an input connected to the replacement address detecting node N50, a transistor Q512 having its source connected to the power supply potential VCC, its drain connected to the replacement address detecting node N50, and its gate connected to an output of the inverter IV511, and an inverter IV512 having its input connected to the output of the inverter IV511 and its output connected to a corresponding redundant word line RWLi (i=1 to 8) for outputting a redundant word line selecting signal.

This redundant row selection circuit RXSi (i=1 to 8) is programmed with an address of the row including a defective memory cell within the corresponding memory cell array, by cutting the fuses corresponding to "1" level signals of the constituent bits X0 to Xm of the row address signal XA and their inverted bits. For example, assuming that the address of the row including the defective memory cell is "0 1 ... 0", the fuses F50b, F51a, ..., F5mb are cut off. With this programming, when the row address signal XA designates the programmed address, all of series circuits of the transistors Q50a, Q50b, ..., Q5ma, Q5mb and the fuses F50a, F50b, ..., F5ma, F5mb are in a non-conducting condition, so that the replacement address detecting node N50 precharged to the power supply potential VCC maintains its potential as it is, and the corresponding redundant word line RWLi is brought to the selection level of the power supply potential VCC (the inverter IV511 and the transistor Q512 constitutes a level holding circuit). When the row address signal XA designates an address other than the programmed address, the series circuits of the transistors Q50a, Q50b, ..., Q5ma, Q5mb and the fuses F50a, F50b, ..., F5ma, F5mb necessarily include a circuit of a conducting condition, so that the replacement address detecting node N50 is discharged toward a ground potential, and therefore, the corresponding redundant word line RWLi is brought to a non-selection level of the ground level.

When the redundant word lines RWLi include one of the selection level, the corresponding row decoder is brought into a deactivated condition by the redundant word line of the selection level, so that all the word lines WL1 to WLM are maintained at a non-selecting level (only this non-selecting circuit for the block of the row decoder XD1 is shown for simplification of the drawing).

FIG. 3 is a circuit diagram illustrating a specific circuit example of the redundant column selection circuits RYS1x and RYS2x.

This redundant column selection circuit RYS1x (RYS2x) includes programming circuits PYA1 to PYA4 including transistors Q111, Q10a, Q10b, . . . , Q1na, Q1nb and fuses F10a, F10b, . . . , F1na, F1nb and associated in common to the redundant digit line RDL1 (RDL2) but to the redundant memory cell column of the memory cell arrays MA1 to MA4, respectively, four transistors Q112 responding to the block selecting signal BS (constituent bits BS1 to BS4) to select one from respective output signals of the programming circuits PYA1 to PYA4, and inverters IV111 and IV112 and a transistor Q113 for holding the signal selected by the transistors Q112 and for outputting the held signal as the redundant digit line selecting signal.

In the redundant column selection circuit RYS1x (RYS2x), when a defective memory cell exists the memory cell array MA1 and a column including the defective memory cell is replaced with a redundant memory cell column, the programming circuit PYA1 is programmed with an address of the column including the defective memory cell. A programming method is similar to that in the redundant row selection circuit RXSi. In addition, since the four programming circuits PYA1 to PYA4 are provided for one redundant digit line RDL1 (RDL2), one of the output signals of these programming circuits is selected by the block selecting signal BS (BS1 to BS4) and is outputted as the redundant digit line selecting signal.

For example, in the case that a defective memory cell exists in the memory cell array MA2 and a column including the defective memory cell is replaced by a redundant memory cell column, when the memory cell array MA2 is selected as a data input/output object (BS2 is at an activated level), the output of the programming circuit PYA2 is selected so that the output of the programming circuit PYA2 is outputted as the redundant digit line selecting signal to the switch circuit SW. When the column address signal YA (Y0 to Yn) designates the address programmed in this programming circuit PYA2, the redundant digit line selecting signal is brought to an activated level, so that the redundant digit line RDL1 (RDL2) is connected to the input/output bus IO. On the other hand, the row decoder XD2 (and the redundant row selection circuits RXS3 and RXS4) is activated by the block selecting signal BS2, so that one of the word lines WL1 to WLM (and the redundant word lines RWL3 and RWLA) is selected. Thus, one redundant memory cell is selected in the redundant memory cell column of the memory cell array MA2 corresponding to the redundant digit line RDL1 (RDL2), so that an input/output of the data is carried out. At this time, the column decoder YD is brought into a deactivated condition by the activated redundant digit line selecting signal outputted from the redundant column selection circuit RYS1x (RYS2x), so that all the digit lines DL1 to DLN are put in a non-selected condition. In addition, the redundant memory cells included in the redundant memory cell columns of the memory cell arrays MA1, MA3 and MA4 are not selected since the block selecting signals BS1, BS3 and BS4 are at the deactivated level.

In this semiconductor memory, an electric consumption can be decreased because it takes a partial operation in which the access to the memory cells and the redundant memory cells and the replacement of the redundant memory cell row and the redundant memory cell column for the memory cell row and the memory cell column are carried out by activating only the block to be accessed.

However, the two memory cell rows and the two memory cell columns are provided for each of the memory cell arrays MA1 to MA4, and there are provided the redundant row selection circuits RXS1 to RXS8 and the redundant column selection circuits RYS1x and RYS2x including the replacement address programming circuit (such as the programming circuits PYA1 to PYA4) each of which is provided for each of the redundant row selection circuits and the redundant column selection circuits and each of which includes a number of fuses requiring a large occupying areas for ensuring reliability since the fuse is cut off ordinarily by a laser beam. Therefore, the area of these circuits is large, with the result that the chip area becomes large. This is a problem.

Incidentally, the number of the redundant memory cell rows and the redundant memory cell columns provided for each one memory cell array, is determined by a tradeoff between the number of the chips which can be recovered by increasing the redundant memory cell rows, the redundant memory cell columns, the redundant row selection circuits and the redundant column selection circuits, and the number of effective chips which can be formed for each one wafer but which is decreased by the chip area increase caused by increasing the above circuits.

FIG. 4 illustrates the relation between the number of redundant memory cell rows and the recovery percentage of defective chips (chips including the defective memory cell (s)) in the semiconductor memory having a predetermined memory capacity. As seen from FIG. 4, if the number of redundant memory cell rows is increased, the recovery percentage elevates, but this relation depicts a saturation curve. On the other hand, if the number of redundant memory cell rows is increased, the chip area increases. Therefore, the number of redundant memory cell rows provided on the chip is determined by paying this tradeoff relation into consideration.

Furthermore, such a situation that all of a plurality of memory cell arrays include a defective memory cell or cells, almost never occurs. A part of the memory cell arrays includes a defective memory cell or cells, and whether or not the memory can be recovered is determined by the number of the redundant memory cell rows associated with the memory cell array including the defective memory cell or cells. In connection with FIG. 4, FIG. 5 shows the relation between the number of the redundant memory cell rows used for replacement (the number of redundant rows used) and the percentage of respective occasions.

The above description has been focused on the redundant memory cell rows, but can be applied to the redundant memory cell columns and the whole including the redundant memory cell rows and the redundant memory cell columns.

As mentioned above, the number of the redundant memory cell rows and the redundant memory cell columns is determined by the above mentioned tradeoff relation, but there are a considerable number of redundant memory cell rows and redundant memory cell columns which are not actually used.

Under this circumstance, there has been proposed a semiconductor memory provided with a predetermined number of redundant memory cell columns and redundant column selection circuits which can be used in common to a plurality of memory cell arrays (composed of ordinary memory cells) in order to reduce the number of the redundant memory cell columns and the redundant column selection circuits (See for example Japanese Patent Application Pre-examination Publication No. JP-A-60150300). One example of this semiconductor memory (second example) is shown in FIG. 6.

In this semiconductor memory (second example), memory cell arrays MA1y to MA4y are constituted of ordinary memory cells, and do not include a redundant memory cell. Alternatively, in common to the memory cell arrays MA1y to MA4y, a redundant memory cell array RMA composed of a plurality of (four) redundant memory cell columns and redundant column selection circuits RYS1y to RYS4y are provided. In order to access the memory cell arrays MA1y to MA4y in parallel, four input/output buses IO11, IO12, . . . , IO41, IO42 are provided, so that a defective memory cell column existing in the memory cell arrays MA1y to MA4y is replaced with one redundant memory cell column in the redundant memory cell array RMA, and data is inputted and outputted through a corresponding input/output bus by means of multiplexers MPX1 to MPX4. In addition, word lines WL1 to WLM are provided in common to the memory cell arrays MA1y to MA4y and the redundant memory cell array RMA, and column decoders YD1 to YD4 are provided for the memory cell arrays MA1y to MA4y, respectively. Incidentally, sense amplifiers is not shown in FIG. 6.

FIG. 7 is a circuit diagram illustrating a specific circuit example of the redundant column selection circuits RYS1y to RYS4y in this semiconductor memory.

This redundant column selection circuit RYSjy (j=1 to 4) includes series circuits composed of transistors Q60a, Q60b, . . . , Q6na, Q6nb receiving constituent bits Y0 to Yn of the column address signal YA and their inverted bits, and fuses F60a, F60b, . . . , F6na, F6nb, and is configured to have a circuit construction similar to that of the redundant column selection circuit RXSi of the first example. The replacement address programming method and the operation are similar to those of the redundant column selection circuit RXSi.

FIG. 8 shows a specific circuit example of the multiplexer MPXj. This multiplexer MPXj comprises a fuse decoder 71 including a plurality of fuses (not shown) corresponding to the input/output buses IO11, IO12, . . . , IO41, IO42 and for outputting a decoded signal, programmed by the above mentioned fuses, for selecting the input/output bus when a redundant digit line selecting signal RDSWj from the corresponding redundant column selection circuit RYSj is at an activated level (selection level). The multiplexer MPXj also comprises transistors Q71, Q73, Q75, Q77 connected between the redundant digit line SRDj1 selected by the redundant column selection circuit RXSi and a switch circuit SWR and the input/output buses IO11, IO21, IO31, IO41, respectively, transistors Q72, Q74, Q76, Q78 connected between the selected redundant digit line SRDj2 and the input/output buses IO12, IO22, IO32, IO42, respectively, and a connection controller 72 receiving the decoded signals from the fuse decoder 71 for on-off controlling the transistors Q71 to Q78 so as to control connection between the selected redundant digit line SRDj1 and SRDj2 and the input/output buses IO11, IO12, . . . , IO41, IO42.

Here, if the memory cell array MA1y includes a defective memory cell and a memory cell column including the defective memory cell is replaced with the redundant memory cell column corresponding to the redundant digit line RDL1 of the redundant memory cell array RMA, the address of the column including the defective memory cell is programmed in the redundant column selection circuit RYS1y, and the fuses in the fuse decoder 71 are cut off to turn on the transistors Q71 and Q72 of the multiplexer MPX1 when the redundant digit line selecting signal RDSW1 is brought to the activated level.

As a result, the column address signal YA (Y0 to Yn) designates the address of the column including the defective memory cell in the memory cell array MA1y, the redundant digit line selecting signal RDSW1 of the activated level is outputted from the redundant column selection circuit RYS1y, so that the redundant digit line RDL1 is selected by the switch circuit SWR and the selected memory cell in the redundant memory cell column is accessed. At this time, the column decoder YD1 is deactivated by the redundant digit line selecting signal RDSW1 of the activated level, so that the memory cell array MA1y is not accessed. In addition, the selected redundant digit lines (SRD11, SRD12) are connected to the input/output buses IO11, IO12 through the multiplexer MPX1, so that the data is inputted and outputted to and from the selected redundant memory cell through these input/output buses.

In this semiconductor memory (second example), it is possible to arbitrarily determine which of the redundant memory cell columns in the redundant memory cell array RMA is substituted for the column included in the memory cell arrays MA1y to MA4y and including the defective memory cell, by means of the redundant column selection circuit RYS1y to RYS4y and the multiplexers MPX1 to MPX4. In addition, since it is unnecessary to provide a predetermined number of redundant memory cell columns for each of the memory cell arrays MA1y to MA4y , it is possible to restrict the number of redundant memory cell columns to the least sufficient number, and therefore, it is possible to correspondingly reduce the chip area.

Of the above mentioned semiconductor memories, the first example can reduce the power consumption by the partial operation, but since the defective address is programmed for each of the memory cell arrays MA1 to MA4, a predetermined number of redundant row (column) selection circuits each having the replacement address programming circuits composed of a number of fuses requiring a large device area, must be provided for each of the memory cell arrays MA1 to MA4, with the result that the chip area disadvantageously becomes large. In addition, the redundant row (column) selection circuits which are not actually used, become many, and therefore, many circuits resultantly become wasteful, with the result that the chip area becomes large by the resultantly wasteful circuits.

On the other hand, in the second example, since the redundant memory cell columns are in common to the memory cell arrays MA1y to MA4y , the number of redundant memory cell columns and redundant column selection circuits can be reduced in comparison with the first example. However, since all the circuits including the memory cell arrays MA1y to MA4y, the redundant memory cell array RMA, the redundant column selection circuits RYS1y to RYS4y and the miltiplexors MPX1 to MPX4 operate simultaneously, the power consumption disadvantageously increases. Here, even if the input/output buses are limited to only one circuit and the memory cell arrays MA1y to MA4y are caused to operate partially, since all the redundant memory cell columns of the redundant memory cell array RMA, the redundant column selection circuits RYS1y to RhS4y and the multiplexer (modified to the one circuit of the input/output bus) operate simultaneously, the power consumption becomes larger than the first example.

SUMMARY OF THE INVENTION

Accordingly, it is an object of the present invention to provide a semiconductor memory which has overcome the above mentioned problems of the prior art.

Another object of the present invention is to provide a semiconductor memory having a chip area smaller than that of the first example and a power consumption smaller than that of the second example.

A semiconductor memory in accordance with the present invention comprises a plurality of memory cell arrays partially operating in accordance with a block selecting signal, each of memory cell arrays including memory cells arranged in a plurality of rows and in a plurality of columns and a first number of redundant memory cell rows, a second number of replacement row address programming circuits each storing the address of a row including a defective memory cell existing in the plurality of memory cell arrays, for generating a redundant row selection discriminating signal of an activated level when the stored address is designated by a given row address, the second number being smaller than the first number, and a plurality of row selection circuits including memory elements corresponding to a third number of replacement row address program circuits of the second number of replacement row address program circuits, the row selection circuits selecting, in accordance with the stored condition of the memory elements, the redundant row selection discriminating signal of the activated level supplied from the corresponding replacement row address programming circuit, for selecting the redundant memory cell row for the memory cell array corresponding to the selected redundant row selection discriminating signal, and putting all the memory cells in the same memory cell array.

In addition, each of the row selection circuits includes fuses provided for the third number of replacement row address program circuits. respectively, and for generating a signal of a different level in accordance with the on-off condition of the fuses, and transistors of the third number receiving at their end the redundant row selection discriminating signals from the third number of replacement row address program circuits, and receiving at their gate an output signal from the fuses, and generating at their other end a redundant row selecting signal. The third number is a plural number equal to or less than the second number.

Furthermore, each of the plurality of memory cell arrays includes a fourth number of redundant memory columns, and the semiconductor memory includes a fifth number of replacement column address programming circuits storing the address of a column including a defective memory cell existing in the plurality of memory cell arrays, for generating a redundant column selection disciminating signal of an activated level when the stored address is designated by a given column address, each of the replacement column address programming circuits being provided for mutually corresponding redundant memory columns in the same column position, of the plurality of memory cell arrays, but the fifth number being less than the number of the mutually corresponding redundant memory columns in the same column position, and column selection circuits provided for the replacement column address programming circuits, respectively, and including memory elements corresponding to the plurality of memory cell arrays, for selecting the redundant column selection discriminating signal of the activated level from the replacement address programming circuits, in accordance with the stored content of the memory elements and the block selecting signal of the activated level, so as to select a corresponding redundant memory cell column and to put all the memory cell columns in the plurality of memory cell arrays into a non-selected condition. Each of the column selection circuits includes fuses provided for the plurality of memory cell arrays, respectively, and for generating a signal of a different level in accordance with the on-off condition of the fuses, and transistors connected to the fuses, respectively, and receiving at their gate the block selecting signal, so as to select the output signal of the replacement column address programming circuit storing the address of the column including the defective memory cell in a predetermined memory cell array of the plurality of memory cell arrays, when the block selecting signal designates the block including the predetermined memory cell array.

BRIEF DESCRIPTION OF THE DRAWINGS

FIG. 15 is a block diagram illustrating a third embodiment of the semiconductor memory in accordance with the present invention.

DESCRIPTION OF THE PREFERRED EMBODIMENTS

Now, embodiments of the present invention will be described with reference to the drawings.

Figure 1:
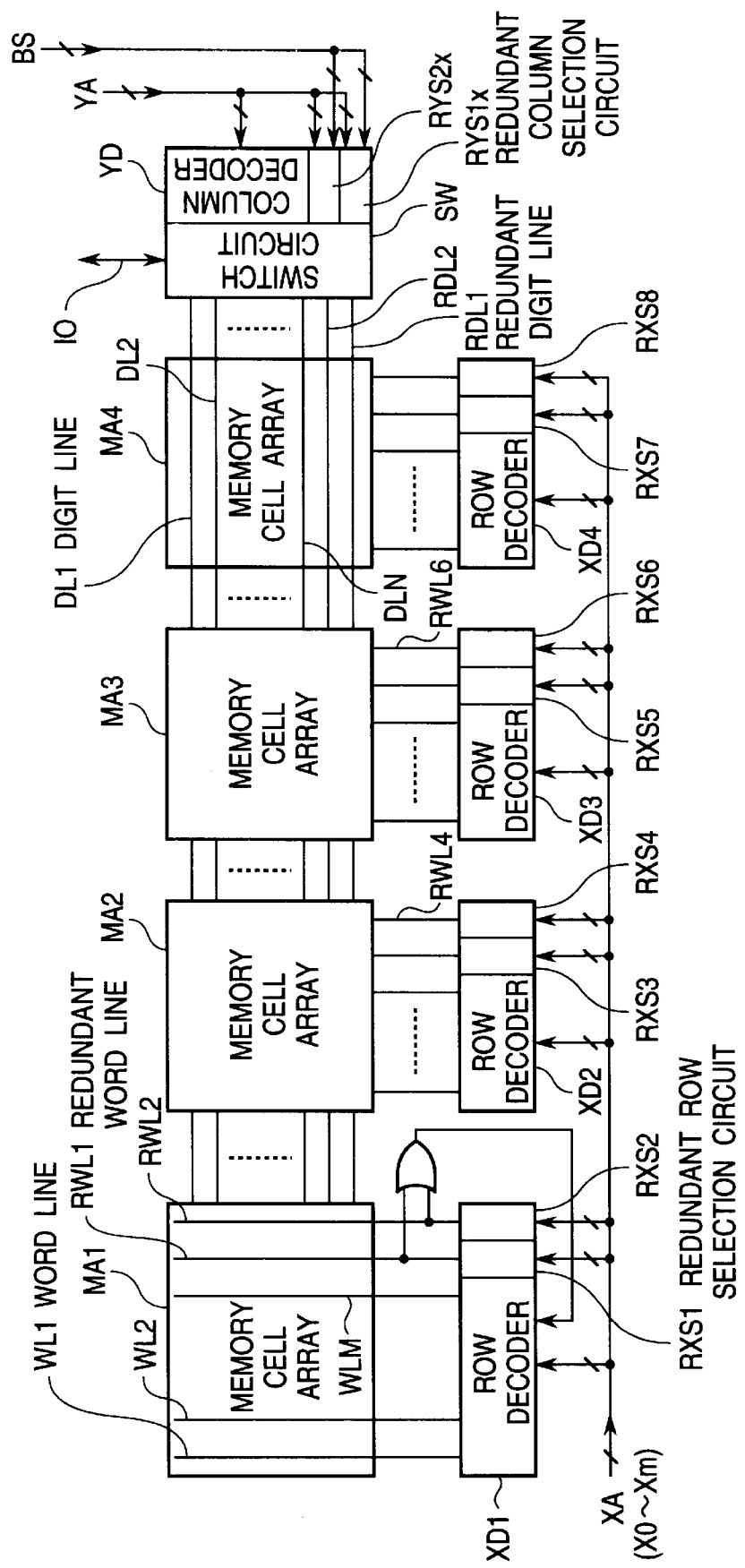
FIG. 1 is a block diagram illustrating the first example of the prior art semiconductor memory.
Figure 9:
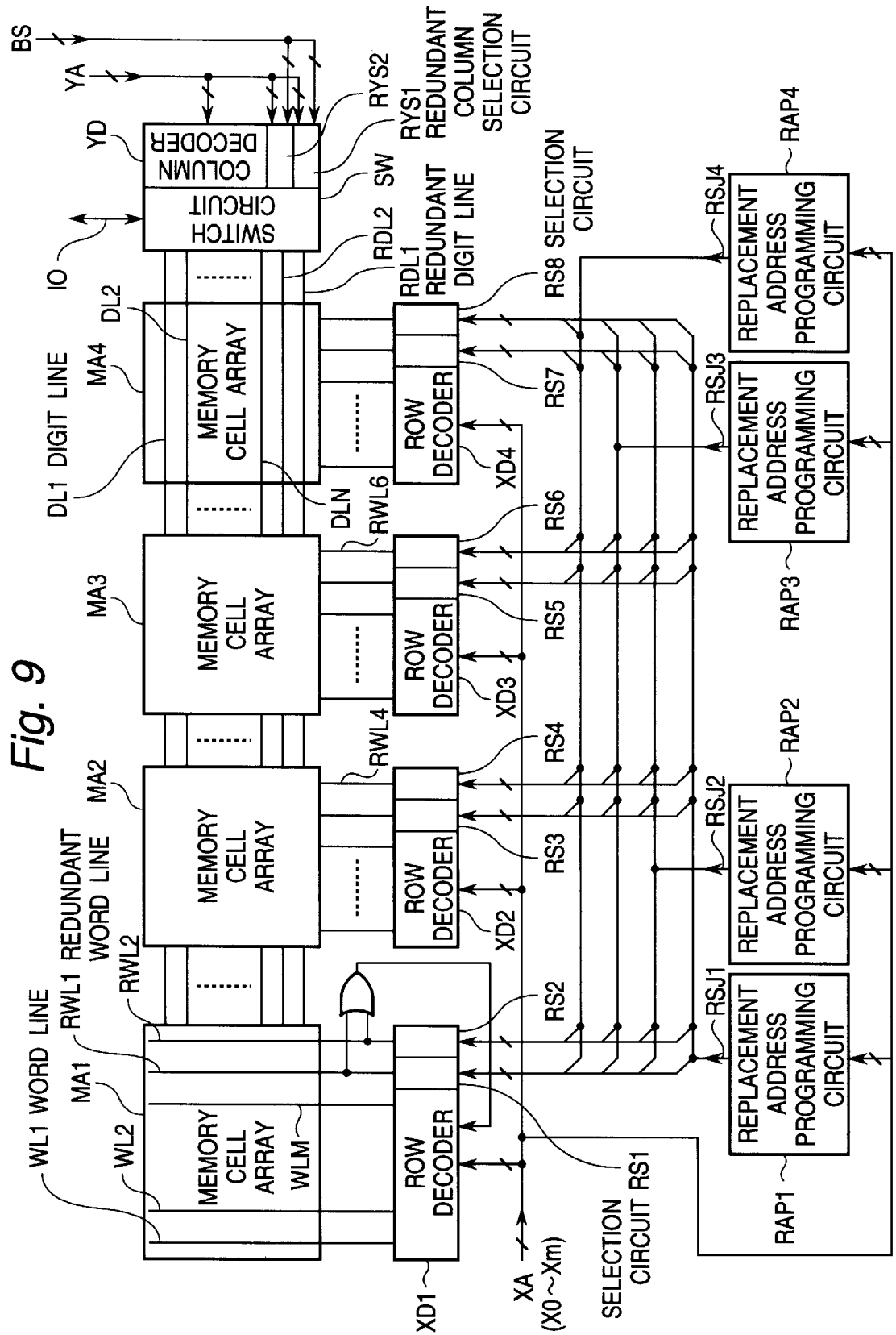
FIG. 9 is a block diagram illustrating a first embodiment of the semiconductor memory in accordance with the present invention.

FIG. 9 is a block diagram illustrating a first embodiment of the semiconductor memory in accordance with the present invention. This first embodiment is different from the first example of the prior art semiconductor memory shown in FIG. 1 (called a "first prior art example" hereinafter) in that the redundant row selection circuits RXS1 to RXS8 are replaced by replacement address programming circuits RAP to RAP4 of the number (4) less than the total number (8) of all the redundant memory cell rows included in the plurality of memory cell arrays MA1 to MA4, each of the replacement address programming circuits RAP1 to RAP4 storing the address of a row including a defective memory cell existing in the plurality of memory cell arrays MA1 to MA4, for outputting a redundant row selection discriminating signal (RSJ1 to RSJ4) of an activated level when the stored address is designated by a given row address XA, and selection circuits RS1 to RS8 including memory elements corresponding to the replacement address programming circuits RAP1 to RAP4, for selecting, in accordance with the stored condition of the memory elements, the redundant row selection discriminating signal from a corresponding replacement address programming circuit, so as to select the redundant memory cell row in the memory cell array corresponding to the selected redundant row selection discriminating signal and to put all the memory cells in the corresponding memory cell array into a non-selected condition (only a non-selecting means for the memory cell array MA1 is shown for simplification of the drawing). The first embodiment is also different from the first prior art example in that the redundant column selection circuits RYS1x and RYS2x are replaced by replacement column selection circuits RYS1 to RYS2 including replacement column address programming circuits each storing the address of a column including a defective memory cell existing in the plurality of memory cell arrays MA1 to MA4, for outputting a redundant column selection discriminating signal of an activated level when the stored address is designated by a given column address YA, each of the replacement column address programming circuits being provided for mutually corresponding redundant memory cell columns in the same column position, of the plurality of memory cell arrays MA1 to MA4, and the number (2) of the replacement column address programming circuits being less than the total number (4) of the redundant memory cell columns included in the same column position, and column selection circuits provided for the replacement column address programming circuits, respectively, and including memory elements corresponding to the memory cell arrays MA1 to MA4, respectively, and for selecting, in accordance with the stored content of the memory elements and the block selecting signal of the activated level, the redundant column selection discriminating signal of the activated level from the replacement column address programming circuits, so as to select the corresponding redundant memory cell column and to put all the memory cells in the memory cell allays MA1 to MA4 into a non-selected condition (the non-selecting means is not shown in the drawing for simplification of the drawing).

Figure 2:
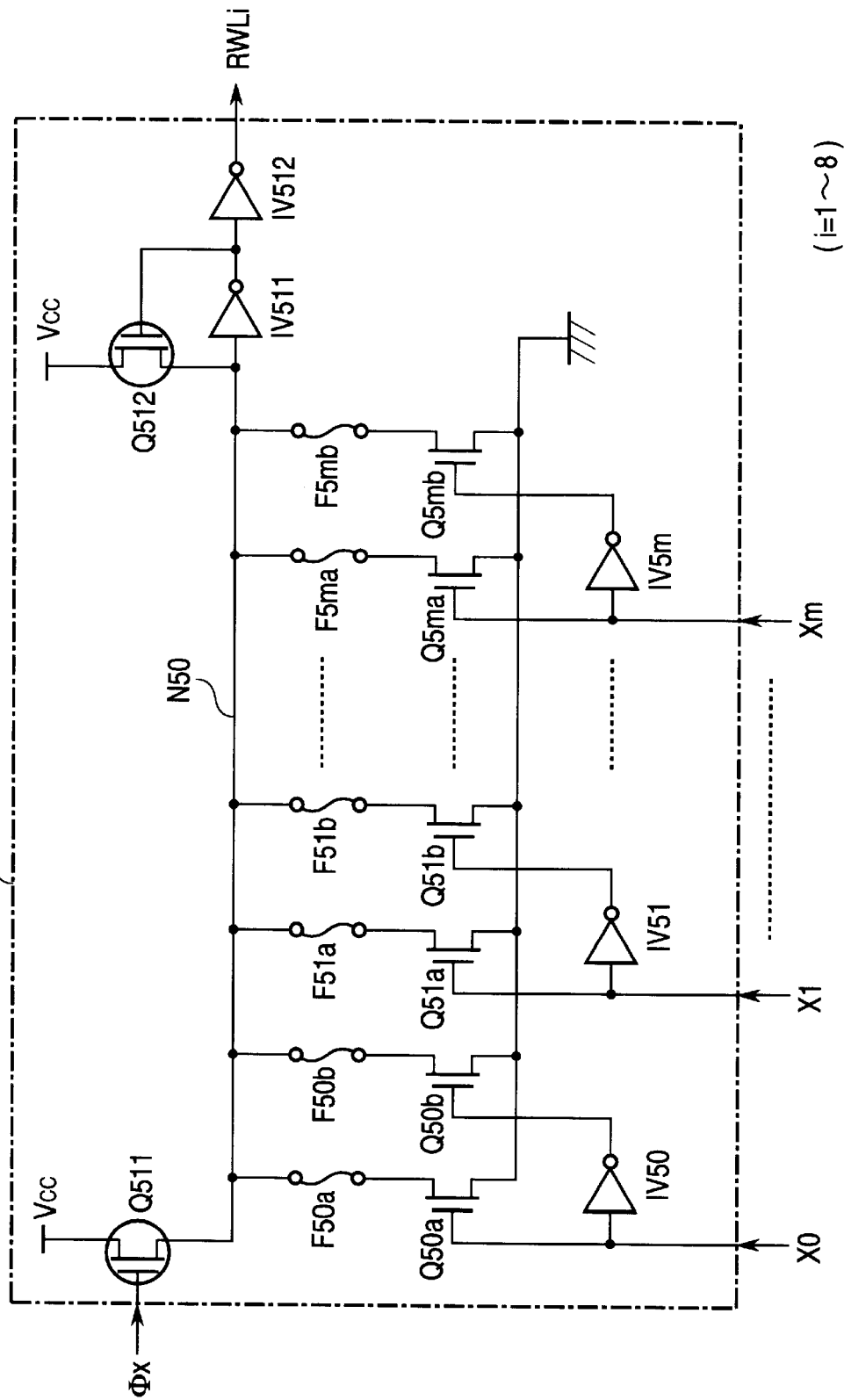
FIG. 2 is circuit diagram illustrating a specific example of the redundant row selection circuit of the semiconductor memory shown in FIG. 1.
Figure 3:
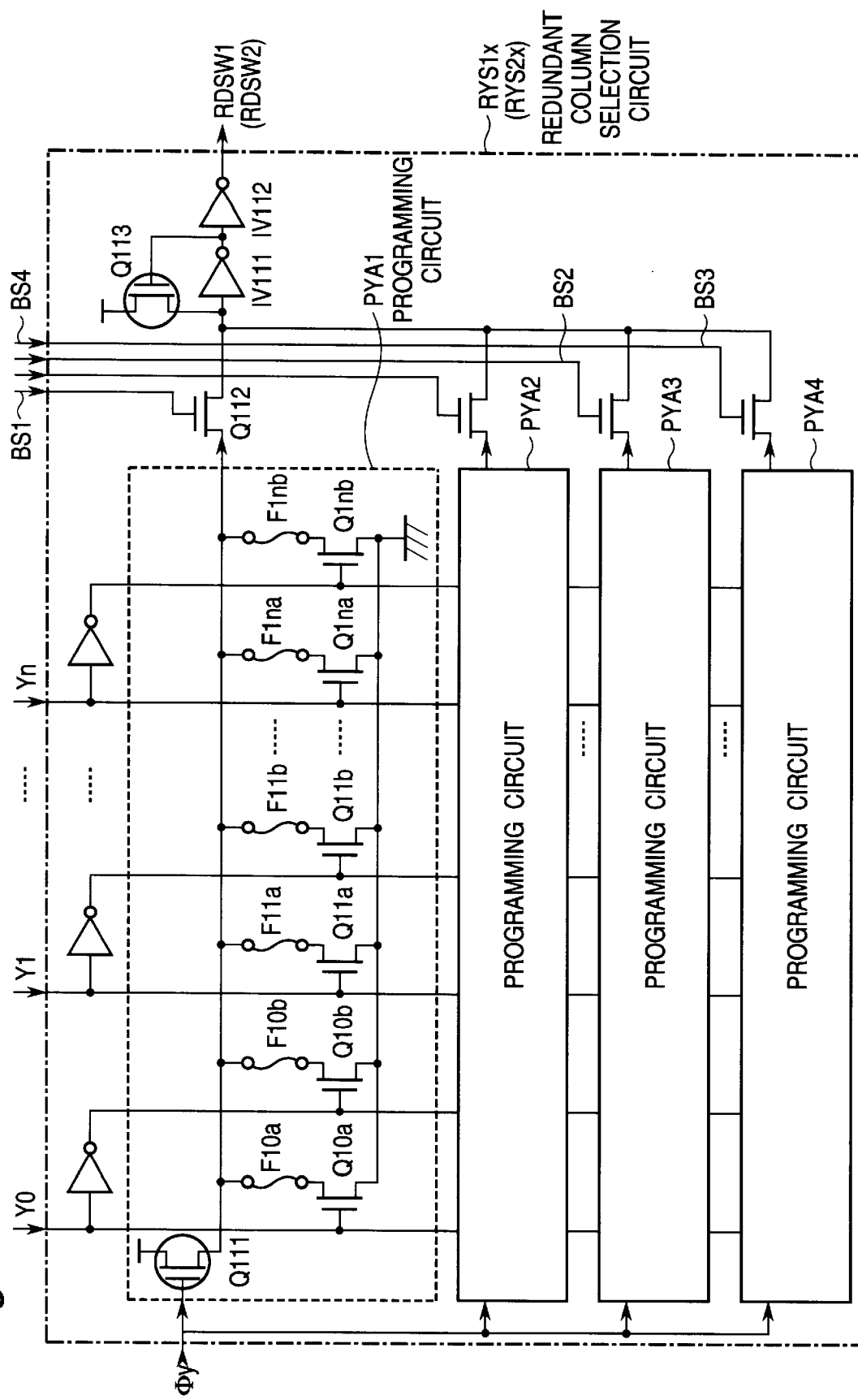
FIG. 3 is a circuit diagram illustrating a specific example of the redundant column selection circuit of the semiconductor memory shown in FIG. 1.
Figure 4:
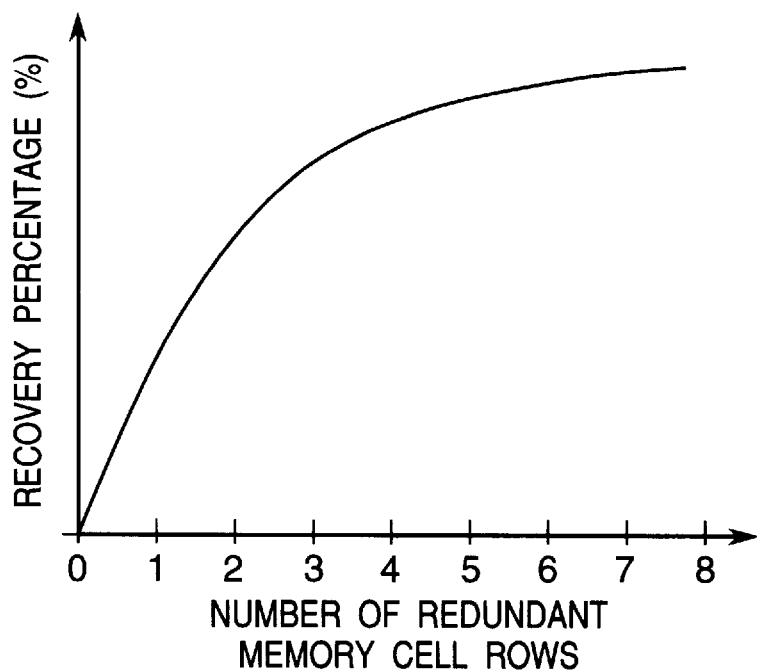
FIG. 4 is a characteristics graph illustrating a relation between the number of redundant memory cell rows in the semiconductor memory shown in FIG. 1 and the recovery percentage.

Each of the replacement address programming circuits RAP1 to RAP4 in this first embodiment has the same circuit construction as that of the redundant row selection circuit (RXS1, etc.) of the first prior art example shown in FIG. 2. In the first prior art example, the address of the defective memory cell row stored in the redundant row selection circuit (for example, RXS1) is one included in a corresponding memory cell array (for example, MA1 ). In this first embodiment, however, the address of the defective memory cell row stored in the replacement address programming circuits RAP1 to RAP4 can be one included in any one of the memory cell arrays, For example, the address of the defective memory cell row included in the memory cell array MA1 can be stored in the replacement address programming circuit RAP4.

Figure 10:
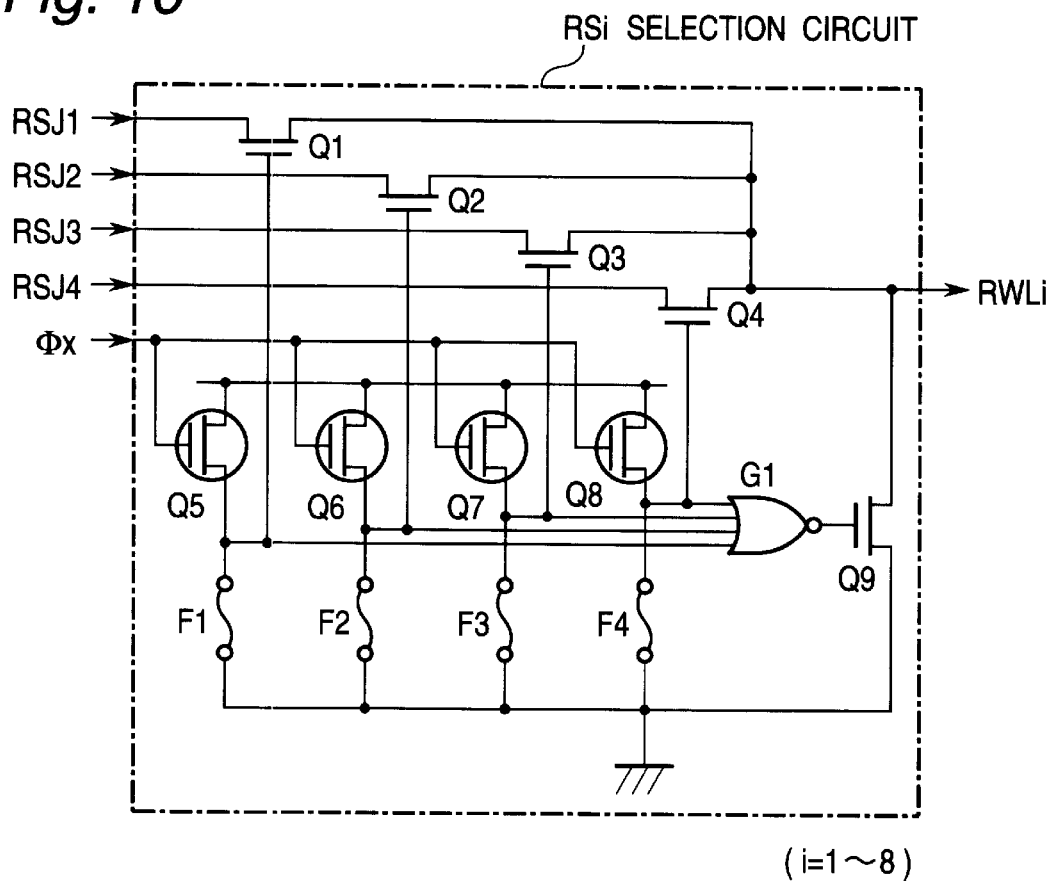
FIG. 10 is a circuit diagram illustrating a specific example of the selection circuit in the first embodiment of the semiconductor memory shown in FIG. 9.

FIG. 10 is a circuit diagram illustrating a specific circuit example of the selection circuits RS1 to RS8 in the first embodiment.

This selection circuit RSi (i=1 to 8) includes fuses F1 to F4 provided for the replacement address programming circuits RAP1 to RAP4, respectively, and having their one end connected in common to a ground potential, P-channel transistors Q5 to Q8 having their source connected in common to a power supply potential, their drain connected to the other end of the fuses F1 to P4, respectively, and their gate receiving a precharge signal Φx, N-channel transistors Q1 to Q4 receiving the redundant row selection discriminating signals RSJ1 to RSJ4, respectively at one of their source and drain, and having their gate connected to the other end of the fuses F1 to F4, respectively, for generating a redundant row selecting signal (for driving the redundant word line RWi) from the other of their source and drain, a NOR gate G1 having four inputs connected to the other end of the fuse F1 to F4, respectively, and an N-channel transistor Q9 having its source connected to the ground potential, its drain connected to an output terminal (RWi) for the redundant row selecting signal, and its gate receiving an output signal of the NOR gate G1.

Next, a method and operation of replacing a defective memory cell row with a redundant memory cell row in this first embodiment will be described.

First, explanation will be made on the case that some number of defective memory cell rows (for example, three defective memory cell rows) exist in the memory cell arrays MA1 to MA4, and are replaced with the redundant memory cell rows. Here, assume that the memory cell arrays including the defective memory cell rows are MA1 , MA3 and MA4, and the address of the defective memory cell row in the memory cell array MA1 is programmed in the replacement address programming circuit RAP1, arid the address of the defective memory cell row in MA3 is programmed in RAP2 and the address of the defective memory cell row in MA4 is programmed in RAP3. The method for programming the address of the defective memory cell row is similar to the first prior art example.

Next, the fuses F1 to F4 in the selection circuit RSi (i=1 to 8) are programmed.

Since the address of the defective memory cell row in the memory cell array MA1 is programmed in the replacement address programming circuit RAP1, the fuse F1 in one of the selection circuits RS1 and RS2, for example, the fuse F1 in the selection circuit RS1, is cut off. Similarly, for the memory cell array MA3, the fuse F2 in one of the selection circuits RS5 and RS6, for example, the fuse F2 in the selection circuit RS5, is cut off, and for the memory cell array MA4, the fuse F3 in one of the selection circuits RS7 and RS8, for example, the fuse F3 in the selection circuit RS7, is cut off.

Here, assuming that the block including the memory cell array MA1 is selected by the block selecting signal and the row address designates the address of the defective memory cell row in the memory cell array MA1, the redundant row selection discriminating signal RSJ1 of the active level is outputted from the replacement address programming circuit RAP1. This redundant row selection discriminating signal RSJ1 is supplied to the transistor Q1 of the selection circuit RS1.

At this time, since the fuse F1 is cut off, the power supply potential is applied to the gate of the transistor Q1 through the transistor Q5 put in a conducting condition by the precharge signal Φx, so that the transistor Q1 is also put in a conducting condition, and therefore, the redundant row selection discriminating signal RSJ1 of the active level (selection level) is transferred to the redundant word line RWL1 as the redundant row selecting signal. Thus, a corresponding redundant memory cell row is selected. Furthermore, since the redundant row selection discriminating signal of the selection level is outputted, the row decoder XD1 is put in a deactivated condition, and all the ordinary memory cells in the memory cell array MA1 are put in a non-selected condition. The redundant row selection discriminating signal RSJ1 outputted from the replacement address programming circuit RAP1 is supplied to the other selection circuits RS2 to RS8, but since the fuse F1 in these selection circuits is not cut off, the redundant memory cell rows corresponding to these selection circuits are not selected.

The replacement of the defective memory cell rows in the memory cell arrays MA3 and MA4 is carried out similarly to the above mentioned case of the memory cell array MA1.

Figure 11:
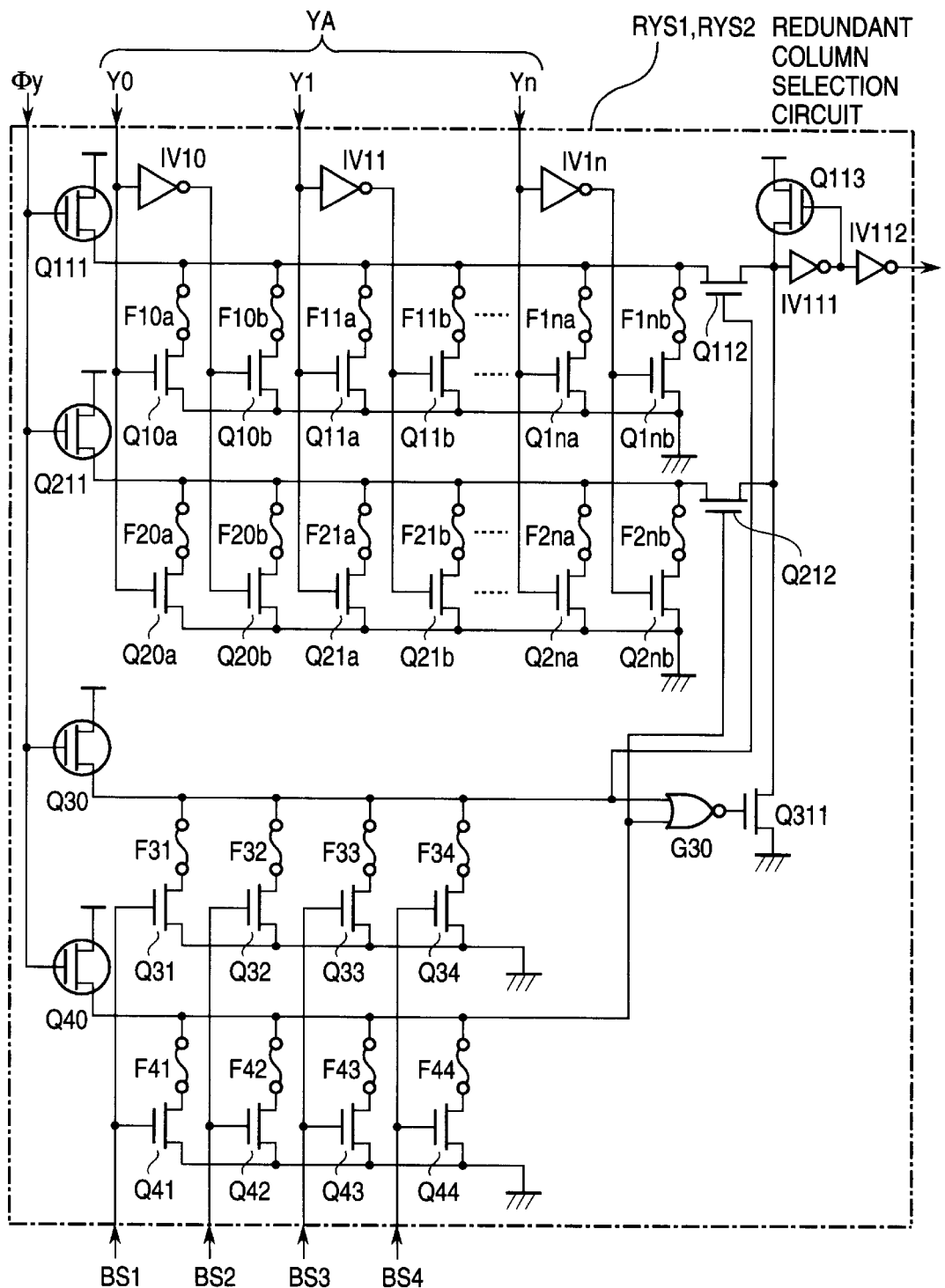
FIG. 11 is a circuit diagram illustrating a specific example of the redundant column selection circuit in the first embodiment of the semiconductor,memory shown in FIG. 9.

FIG. 11 is a circuit diagram illustrating a specific circuit example of the redundant column selection circuits RYS1 and RYS2 in the first embodiment.

Each of the redundant column selection circuits RYS1 and RYS2 comprises two replacement address programming circuits composed of precharging transistors Q111 and Q211, fuses F10a, F10b, . . . , F1na, F1nb, F20a, F20b, . . . , F2na, F2nb and transistors Q10a, Q10b, . . . , Q1na, Q1nb, Q20a, Q20b, . . . , Q2na, Q2nb, provided to associate to the constituent bits Y0 to Yn of the column address signal YA and their inverted bits, respectively, two block selection programming circuits provided to associate to the above mentioned replacement address programming circuits, respectively and composed of precharging transistors Q30 and Q40, fuses F31, . . . , F34, F41, . . . , F44 and transistors Q31, . . . , Q34, Q41, . . . , Q44, provided to associate to the constituent bits BS1 to BS4 of the block selecting signal BS, respectively, and a selection switching circuit composed of transistors Q112, Q212 and Q311 and a NOR gate G30.

Next, explanation will be made about an operation of the redundant column selection circuits RYS1 and RYS2, the method of programming the replacement column address, and an operation of replacing a defective memory cell column by a redundant memory cell column. Here, it is assumed that defective memory cells exist in the memory cell arrays MA2 and MA4 and a defective memory cell column in each of these memory cell arrays is replaced with a redundant memory cell column.

First, the address of the defective memory cell columns in the memory cell arrays MA2 and MA4 is programmed in the redundant colunn selection circuits RYS1 and RYS2. At this time, the addresses of the two defective memory cell columns can be separately programmed in the two redundant column selection circuits RYS1 and RYS2, respectively, or alternatively, can be programmed together in one redundant column selection circuit, for example, RYS1. In the following, the latter case will be explained. Incidentally, the programming method is similar to that for the replacement address programming circuit RAP1.

The address of the defective memory cell columns in the memory cell array MA2 is programmed in one of the two replacement column address programming circuits of the redundant column selection circuit RYS1, for example, the replacement column address programming circuit of the fuse F10a side, and the address of the defective memory cell columns in the memory cell array MA4 is programmed in the replacement column address programming circuit of the fuse F20a side. At the same time, the block selection programming circuits are programmed. Since the fuse F10a side corresponds to the block of the memory cell array MA2, the fuse F32 corresponding to the block selecting signal BS2 is cut off. In addition, since the fuse F20a side corresponds to the block of the memory cell array MA4, the fuse F44 corresponding to the block selecting signal BS4 is cut off, Here, assuming that the block of the memory cell array MA2 is selected (the signal BS2 is at an activated level (high level)) and the column address signal YA designates the address in the defective memory cell column in the memory cell array MA2, the transistor Q32 is rendered conductive by the block selecting signal BS2, but since the fuse F32 is cut off, the power supply potential is supplied through the transistor Q30 to the gate of the transistor Q112, so that the transistor Q112 is put in a conducting condition, and therefore, the redundant column selecting signal of the activated level (high level) is outputted from the replacement column address programming circuit of the fuse F10a side through inverters IV111 and IV112. Thus, the redundant digit line RDL1 is selected.

On the other hand, since only the block of the memory cell array MA2 is put in the activated condition by the block selecting signal BS2, the redundant memory cell column of the memory cell array MA2 is selected, so that the redundant memory cell of the redundant memory cell column, corresponding to the word line selected by the row decoder DX2, is accessed.

At this time, since the fuse F42 is not cut off, the transistor Q212 is in a non-conducting condition, and therefore, even if the replacement column address programming circuit of the fuse F20 side is programmed with completely the same address as that programmed in the replacement column address programming circuit of the fuse F10a side, no collision occurs. In addition, if the fuses F31 to F34 and F41 to F44 are not cut off, no signal is outputted from the replacement column address programming circuit, and therefore, no redundant memory cell column is selected.

Figure 5:
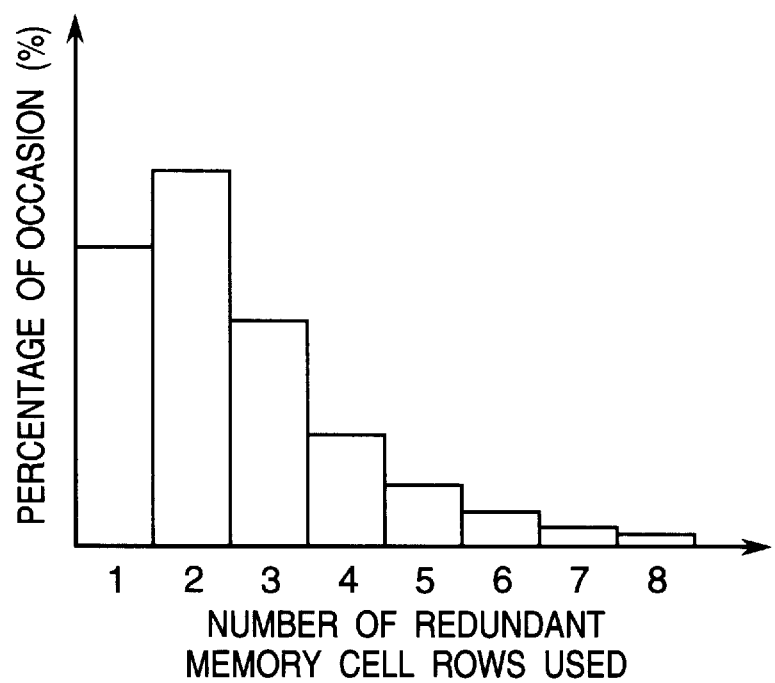
FIG. 5 is a characteristics graph illustrating a relation between the number of redundant memory cell rows actually used in the semiconductor memory shown in FIG. 1 and the percentage of respective occasions.
Figure 6:
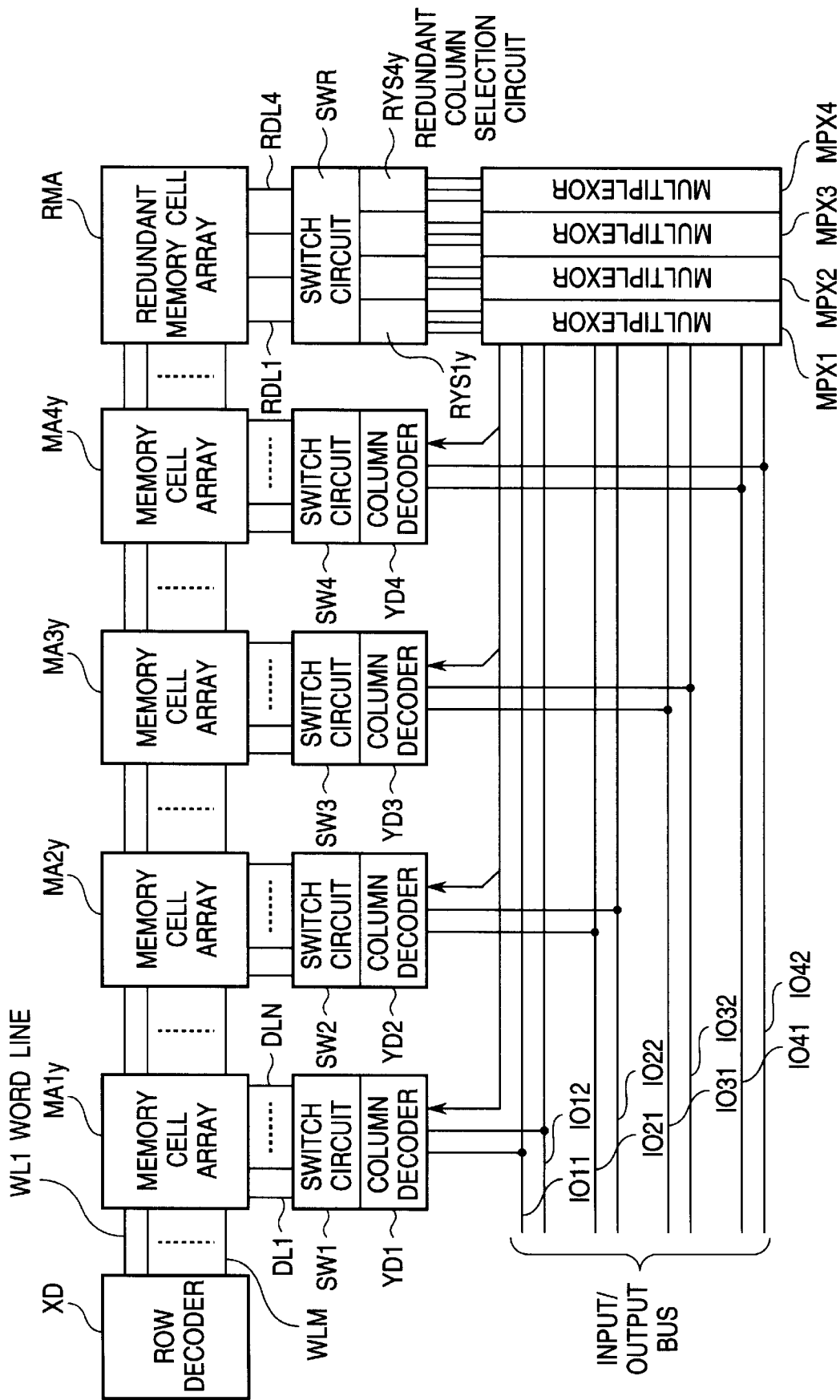
FIG. 6 is a block diagram illustrating the second example of the prior art semiconductor memory.
Figure 7:
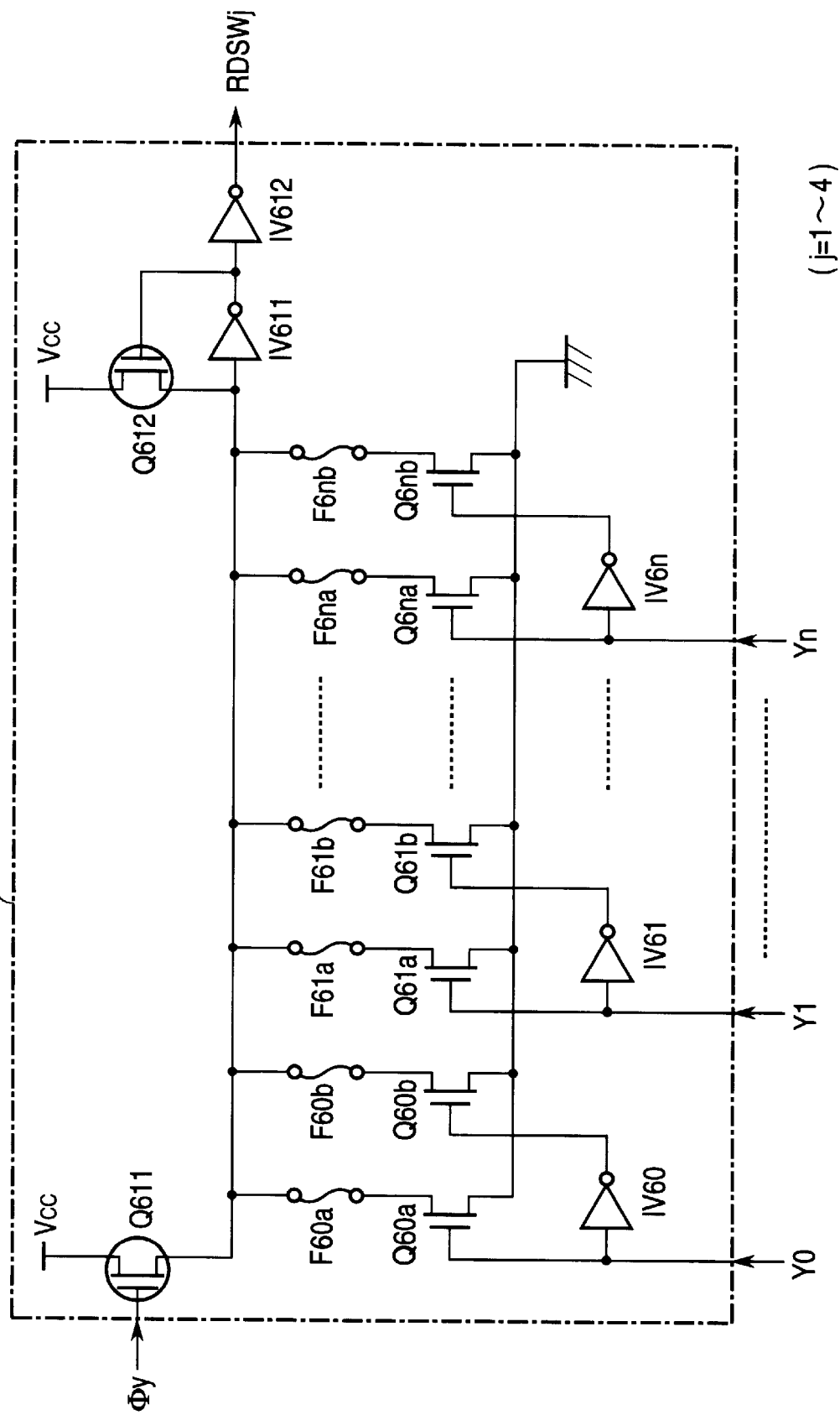
FIG. 7 is a circuit diagram illustrating a specific example of the redundant column selection circuit of the semiconductor memory shown in FIG. 6.
Figure 8:
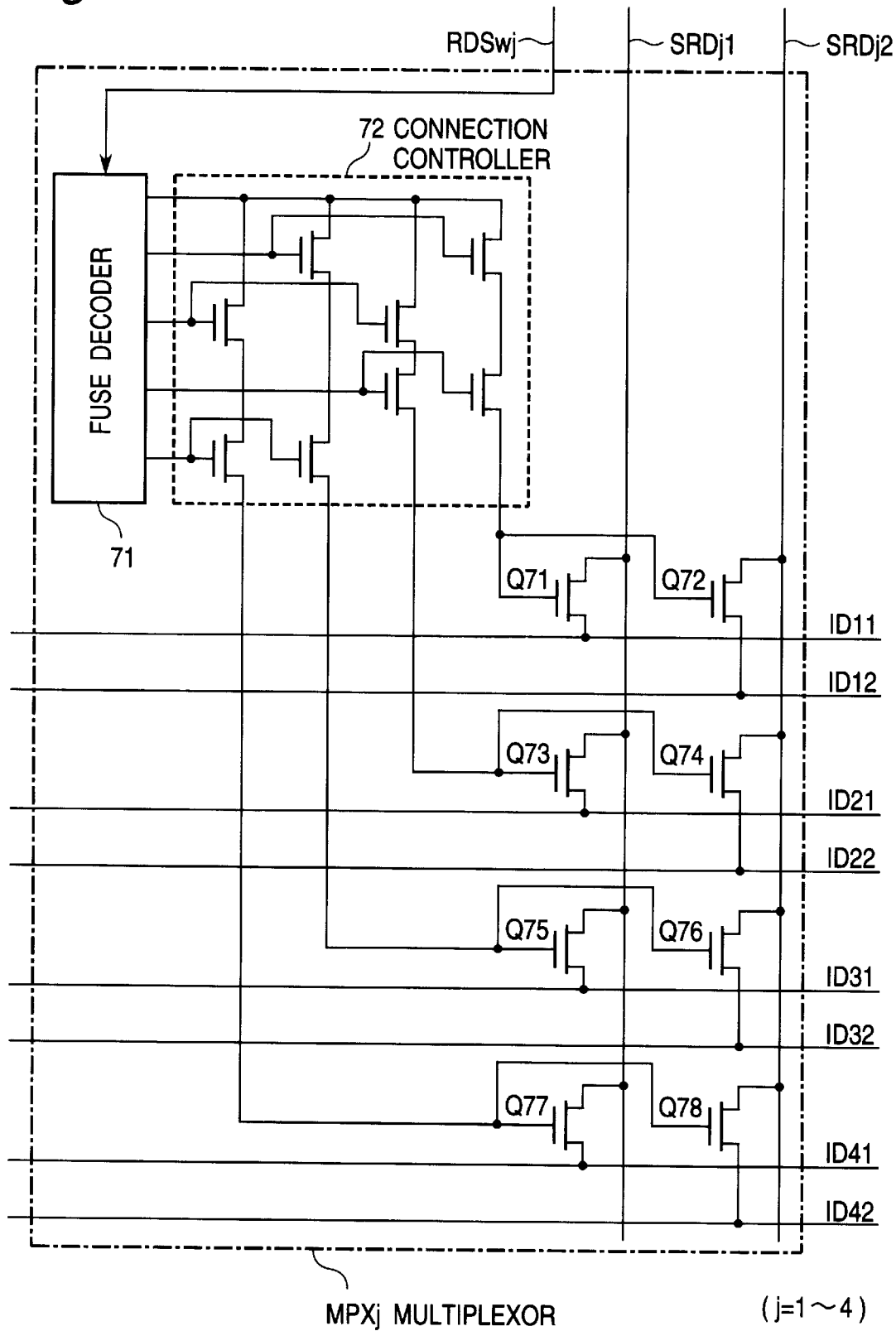
FIG. 8 is a circuit diagram illustrating a specific example of the multiplexer of the semiconductor memory shown in FIG. 6.

In this first embodiment, the number of the replacement address programming circuits RAP1 to RAP4 and the replacement column address programming circuits of the redundant column selection circuits RYS1 and RYS2, which include a number of fuses requiring a large occupying area, can be reduced to one half of the number of the redundant memory cell rows and the redundant memory cell columns. In addition, the number of fuses for selection used in these circuits is sufficiently smaller than that of the fuses for programming one row address or one column address. Therefore, the total area of the replacement address programming circuits RAP1 to RAP4, the selection circuits RSS1 to RS8 and the redundant column selection circuits RYS1 and RYS2, can be remarkably reduced in comparison with that of the corresponding circuits in the first prior art example, and therefore, the chip area can be correspondingly reduced. For example, assuming that the memory is constructed of four blocks and each of the row address and the column address is constituted of eight bits, 256 fuses were required in the first prior art example, but in the present invention, the number of the fuses is reduced to 176, and the area required for the fuses can be reduced by about 31%. Furthermore, even if the number of the replacement address programming circuits RAP1 to RAP4 and the replacement column address programming circuits is small, since the number of these circuits actually used is smaller than the number of the redundant memory cell row and the redundant memory cell column as seen from FIG. 5, the recovery percentage almost never lowers.

In addition, since the redundant memory cell rows and the redundant memory cell columns are distributed in the memory cell arrays MA1 to MA4 and since the memory cell arrays are caused to partially operate in units of each memory cell array, the power consumption can be reduced in comparison with the second prior art example.

Figure 12:
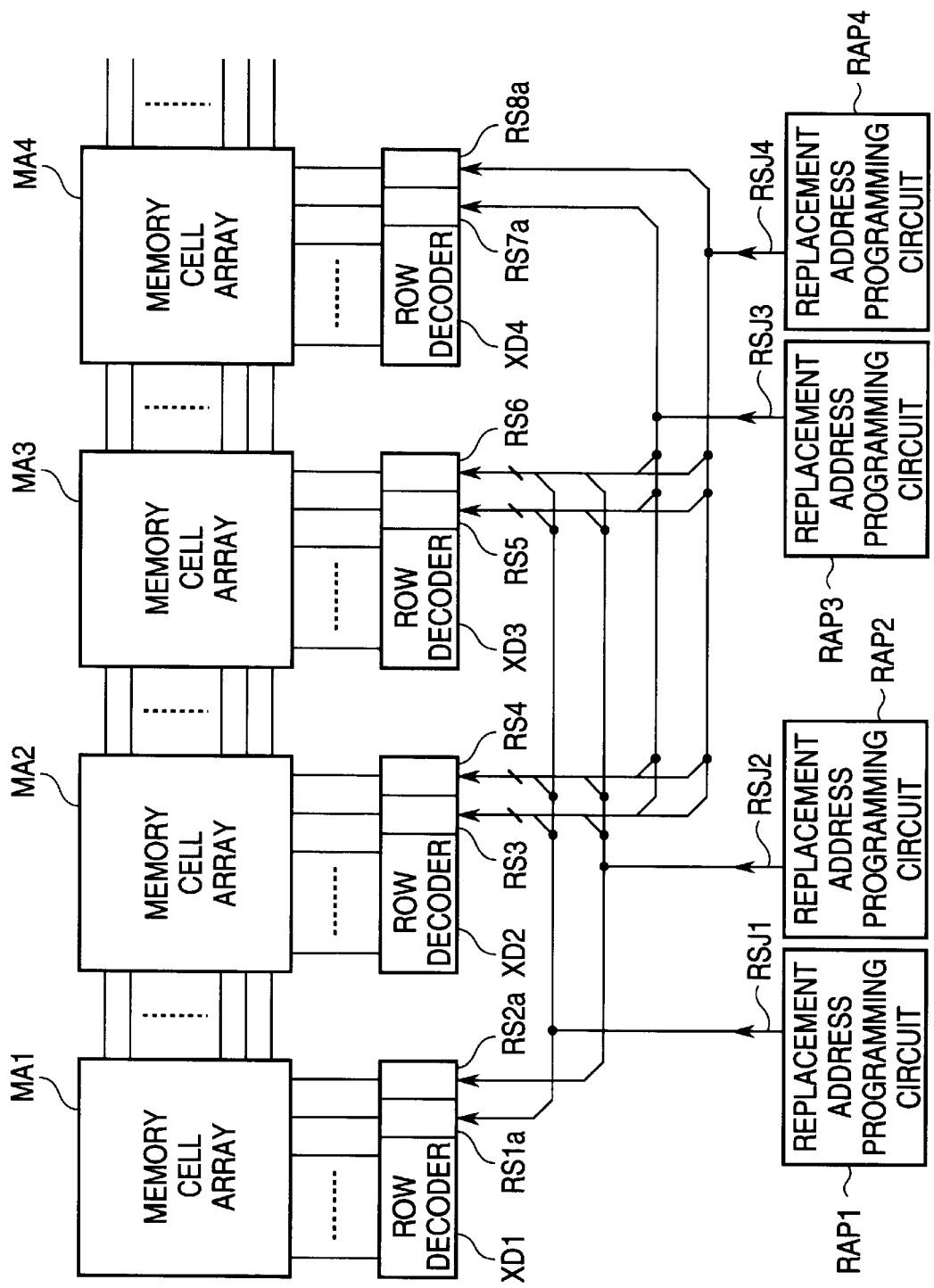
FIG. 12 is a block diagram illustrating a second embodiment of the semiconductor memory in accordance with the present invention.

FIG. 12 is a block diagram illustrating a second embodiment of the semiconductor memory in accordance with the present invention.

In the first embodiment, each of the selection circuits RS1 to RS8 selects one from among the output signals outputted from the four replacement address programming circuits RAP1 to RAP4, but in this second embodiment, each of selection circuits RS1a, RS2a, RS7a and RS8a associated to the memory cell arrays MA1 and MA4 is configured to receive and select an output signal of one replacement address programming circuit.

With this arrangement, the number of the fuses used in the selection circuits can be reduced while maintaining the recovery percentage comparable to that in the first embodiment, and therefore, the chip area can be correspondingly reduced.

Figure 13:
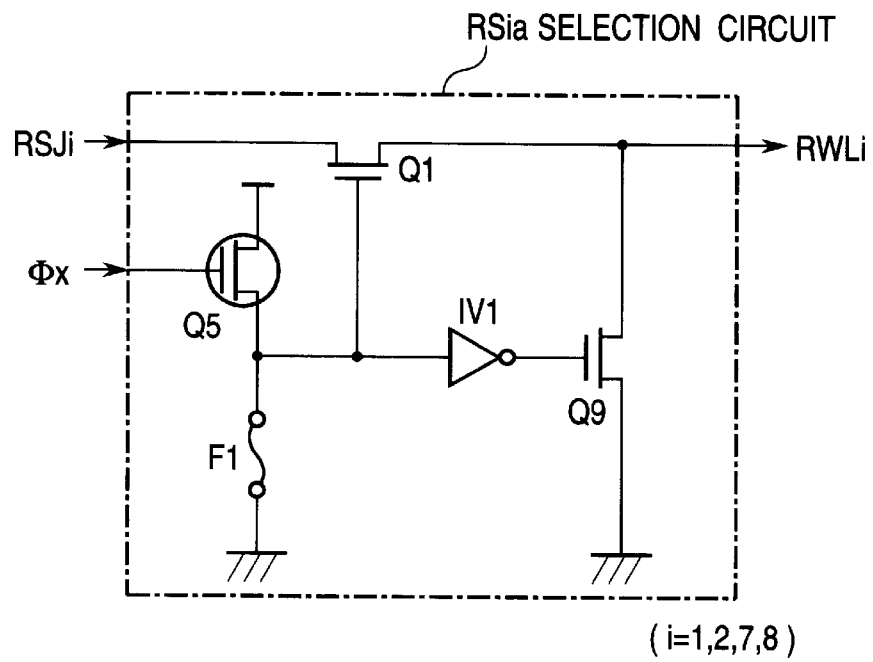
FIG. 13 is a circuit diagram illustrating a specific example of the predetermined selection circuit in the second embodiment of the semiconductor memory shown in FIG. 12.

A circuit diagram of a specific circuit example of the selection circuits RS1a, RS2a, RS7a and RS8a in the second embodiment is shown in FIG. 13. As seen from the drawing, these selection circuits include only one fuse (F1).

In the embodiment shown in FIG. 12, the circuit for selecting the output signal of one replacement address programming circuit is associated to each of the memory cell arrays MA1 and MA4, but the relation of association can be arbitrarily determined. On the other hand, since the replacement address programming circuits used for one memory cell array are two without modification, no restriction in selection or in connection, which lowers the recovery percentage, occurs between the selection circuits and the replacement address programming circuits, and therefore, the recovery percentage comparable to that in the first embodiment can be achieved.

Figure 14:
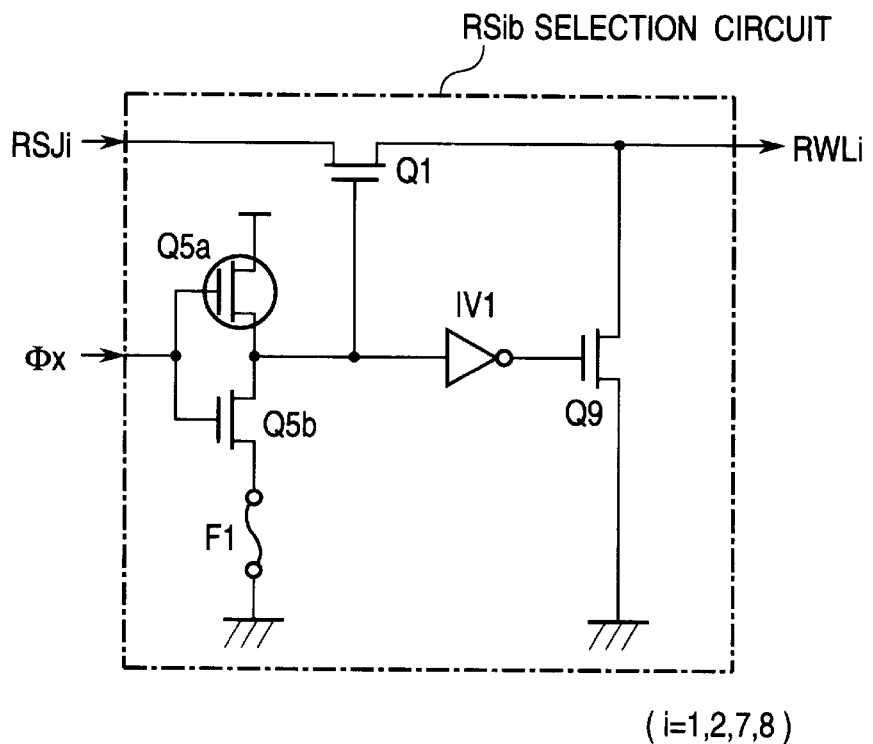
FIG. 14 is a circuit diagram illustrating a modification of the selection circuit shown in FIG. 13.

FIG. 14 is a circuit diagram illustrating a modification of the selection circuit for selecting the output signal of one replacement address programming circuit.

In this selection circuit RSib (i=1, 2, 7, 8), a transistor Q5 in the above mentioned selection circuit RSia is replaced by a CMOS circuit, so that when a precharging is carried out in response to the precharge signal Φx, a pass-through current is prevented from flowing through the fuse F1, and therefore, the power consumption can be further reduced.

FIG. 15 is a block diagram illustrating a third embodiment of the semiconductor memory in accordance with the present invention.

This third embodiment is featured in that, selection circuits RS3c to RS6c each for selecting one from among the output signals of two replacement address programming circuits are provided in place of the selection circuits RS3 to RS6, provided in the second embodiment, for selecting one from among the output signals of the four replacement address programming circuits RAP1 to RAP4.

Figure 16:
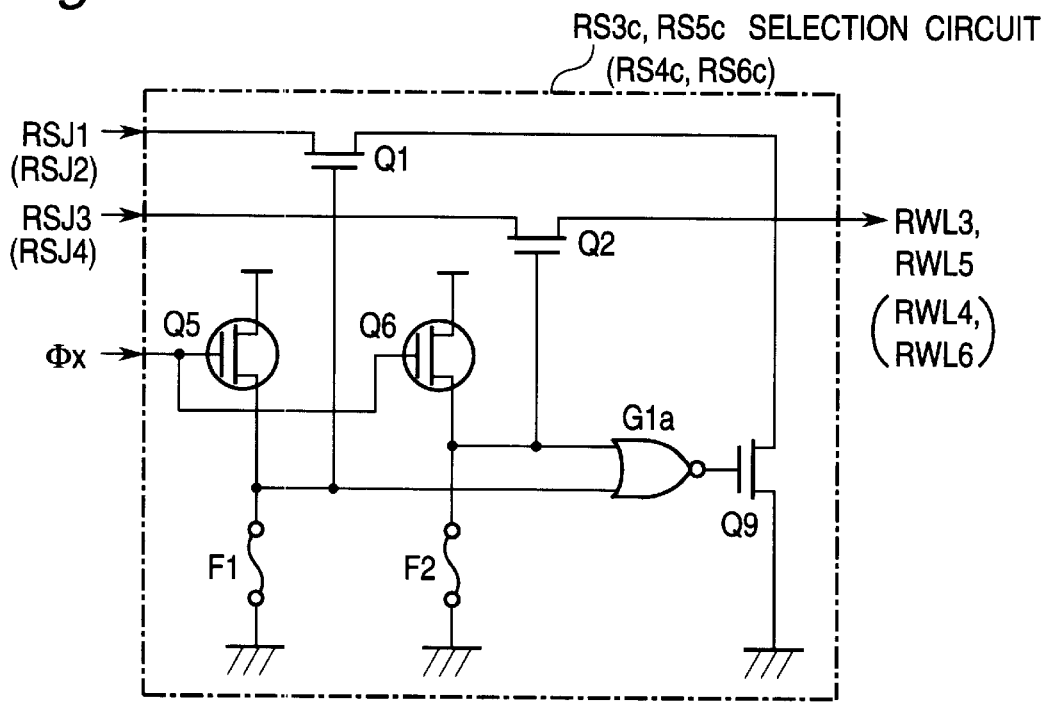
FIG. 16 is a circuit diagram illustrating a specific example of the predetermined selection circuit in the third embodiment of the semiconductor memory shown in FIG. 15.

A circuit diagram of a specific circuit example of the selection circuits RS3c to RS6c is shown in FIG. 16. In these selection circuits, the number of the fuses (F1, F2) is two, and therefore, the chip area can be further reduced in comparison with the second embodiment. In addition, the recovery percentage is comparable to those realized in the first and second embodiments.

Incidentally, which of the memory cell arrays MA1 to MA4 is associated to each two circuits for receiving and selecting the output signal of one or two replacement address programming circuits, is not limited to the associating relation shown in FIG. 15, but can be freely determined.

This third embodiment can reduce the area of the fuses by about 39% in comparison with the first prior art example, and therefore, can correspondingly reduce the chip area. The low power consumption type circuit shown in FIG. 14 can be applied to the selection circuits RS3c to RS6c.

As mentioned above, according to the present invention, each of a plurality of memory cell arrays includes redundant memory cell rows and redundant memory cell columns, and the memory cell arrays are caused to partially operate. The replacement row address programming circuits and the replacement column address programming circuits of the number smaller than the number of the redundant memory cell rows and the redundant memory cell columns are provided, and one output signal is selected from among the output signals of these replacement row (column) address programing circuits so that the redundant memory cell row or the redundant memory cell column is selected by tie selected output signal. With this arrangement, the total area of the replacement row (column) address programming circuits including a number of fuses occupying a large area can be made smaller than that of the first prior art example, and therefore, the chip area can be reduced. Since the memory including the redundant memory cell rows and the redundant memory cell columns can be caused to partially operate, the power consumption can be made smaller than that in the second prior art example.

I claim:

1. A semiconductor memory comprising a plurality of memory cell arrays partially operating in accordance with a block selecting signal, each of memory cell arrays including memory cells arranged in a plurality of rows and in a plurality of columns and a first number of redundant memory cell rows, a second number of replacement row address programming circuits each storing the address of a row including a defective memory cell existing in the plurality of memory cell arrays, for generating a redundant row selection discriminating signal of an activated level when the stored address is designated by a given row address, the second number being smaller than the first number, and a plurality of row selection circuits including memory elements corresponding to a third number of replacement row address program circuits of the second number of replacement row address program circuits, the row selection circuits selecting, in accordance with the stored condition of the memory elements, the redundant row selection discriminating signal of the activated level supplied from the corresponding replacement row address programming circuit, for selecting the redundant memory cell row for the memory cell array corresponding to the selected redundant row selection discriminating signal, and putting all the memory cells in the same memory cell array.

2. A semiconductor memory claimed in claim 1 wherein each of the row selection circuits includes fuses provided for the third number of replacement row address program circuits, respectively, and for generating a signal of a different level in accordance with the on-off condition of the fuses, and transistors of the third number receiving at their end the redundant row selection discriminating signals from the third number of replacement row address program circuits, and receiving at their gate an output signal from the fuses, and generating at their other end a redundant row selecting signal.

3. A semiconductor memory claimed in claim 1 wherein the third number is a plural number equal to or less than the second number.

4. A semiconductor memory claimed in claim 1 wherein each of the plurality of memory cell arrays includes a fourth number of redundant memory columns, and the semiconductor memory includes a fifth number of replacement column address programming circuits storing the address of a column including a defective memory cell existing in the plurality of memory cell arrays, for generating a redundant column selection discriminating signal of an activated level when the stored address is designated by a given column address, each of the replacement column address programming circuits being provided for mutually corresponding redundant memory columns in the same column position, of the plurality of memory cell arrays, but the fifth number being less than the number of the mutually corresponding redundant memory columns in the same column position, and column selection circuits provided for the replacement column address programming circuits, respectively, and including memory elements corresponding to the plurality of memory cell arrays, for selecting the redundant column selection discriminating signal of the activated level from the replacement column address programming circuits, in accordance with the stored content of the memory elements and the block selecting signal of the activated level, so as to select a corresponding redundant memory cell column and to put all the memory cell columns in the plurality of memory cell arrays into a non-selected condition.

5. A semiconductor memory claimed in claim 4 wherein each of the column selection circuits includes fuses provided for the plurality of memory cell arrays, respectively, and for generating a signal of a different level in accordance with the on-off condition of the fuses, and transistors connected to the fuses, respectively, and receiving at their gate the block selecting signal, so as to select the output signal of the replacement column address programming circuit storing the address of the column including the defective memory cell in a predetermined memory cell array of the plurality of memory cell arrays, when the block selecting signal designates the block including the predetermined memory cell array.

\* \* \* \* \*